(12) United States Patent
Bentley et al.

(10) Patent No.: US 9,640,636 B1
(45) Date of Patent: May 2, 2017

(54) METHODS OF FORMING REPLACEMENT GATE STRUCTURES AND BOTTOM AND TOP SOURCE/DRAIN REGIONS ON A VERTICAL TRANSISTOR DEVICE

(71) Applicant: GLOBALFOUNDRIES Inc., Grand Cayman (KY)

(72) Inventors: Steven J. Bentley, Menands, NY (US); John H. Zhang, Altamont, NY (US); Kwan-Yong Lim, Niskayuna, NY (US); Hiroaki Niimi, Cohoes, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/171,795

(22) Filed: Jun. 2, 2016

(51) Int. Cl.
| | |
|---|---|
| H01L 21/8234 | (2006.01) |
| H01L 29/66 | (2006.01) |
| H01L 29/06 | (2006.01) |
| H01L 29/417 | (2006.01) |
| H01L 29/08 | (2006.01) |
| H01L 21/306 | (2006.01) |
| H01L 21/02 | (2006.01) |

(52) U.S. Cl.
CPC .... H01L 29/66666 (2013.01); H01L 21/0217 (2013.01); H01L 21/02126 (2013.01); H01L 21/02164 (2013.01); H01L 21/30604 (2013.01); H01L 21/823418 (2013.01); H01L 21/823431 (2013.01); H01L 21/823487 (2013.01); H01L 29/0649 (2013.01); H01L 29/0847 (2013.01); H01L 29/41741 (2013.01); H01L 29/6653 (2013.01); H01L 29/66545 (2013.01)

(58) Field of Classification Search
CPC ....... H01L 21/70; H01L 21/702; H01L 21/71; H01L 21/8232; H01L 29/0852; H01L 29/66409
See application file for complete search history.

(56) References Cited

U.S. PATENT DOCUMENTS

| | | | |
|---|---|---|---|
| 5,342,797 A | 8/1994 | Sapp et al. | |
| 5,414,289 A | 5/1995 | Fitch et al. | |
| 6,372,559 B1 | 4/2002 | Crowder et al. | |

(Continued)

OTHER PUBLICATIONS

Hergenrother et al., "The Vertical Replacement-Gate (VRG) MOSFET: A 50-nm Vertical MOSFET with Lithography-Independent Gate Length," IEDM 99-75, IEEE 1999.

(Continued)

*Primary Examiner* — Cheung Lee
(74) *Attorney, Agent, or Firm* — Amerson Law Firm, PLLC

(57) ABSTRACT

One illustrative method disclosed herein includes, among other things, forming an initial vertically oriented channel semiconductor structure having a first height above a substrate, forming a sacrificial spacer structure adjacent the initial vertically oriented channel semiconductor structure and, with the sacrificial spacer in position, performing at least one process operation to define a self-aligned bottom source/drain region for the device that is self-aligned with respect to the sacrificial spacer structure, forming an isolation region in the trench and forming a bottom source/drain electrode above the isolation region. The method also includes removing the sacrificial spacer structure and forming a bottom spacer material around the vertically oriented channel semiconductor structure above the bottom source/drain electrode.

24 Claims, 14 Drawing Sheets

(56) References Cited

U.S. PATENT DOCUMENTS

| | | |
|---|---|---|
| 6,686,604 B2 | 2/2004 | Layman et al. |
| 6,690,040 B2 | 2/2004 | Chaudhry et al. |
| 6,759,730 B2 | 7/2004 | Chaudhry et al. |
| 7,241,655 B2 | 7/2007 | Tang et al. |
| 7,465,622 B2 | 12/2008 | Lin |
| 7,666,733 B2 | 2/2010 | Deleonibus |
| 7,700,432 B2 | 4/2010 | Chaudhry et al. |
| 8,637,849 B2 | 1/2014 | Deligianni et al. |
| 9,224,840 B2 | 12/2015 | Flachowsky et al. |
| 2003/0047749 A1 | 3/2003 | Chaudhry et al. |
| 2003/0119237 A1 | 6/2003 | Chittipeddi et al. |
| 2007/0111414 A1 | 5/2007 | Chaudhry et al. |
| 2011/0253981 A1 | 10/2011 | Rooyackers et al. |
| 2013/0341702 A1 | 12/2013 | Kar et al. |
| 2016/0005850 A1 | 1/2016 | Zhao et al. |

OTHER PUBLICATIONS

Notice of Allowance from related U.S. Appl. No. 15/097,574 dated Sep. 14, 2016.

METHODS OF FORMING REPLACEMENT GATE STRUCTURES AND BOTTOM AND TOP SOURCE/DRAIN REGIONS ON A VERTICAL TRANSISTOR DEVICE

BACKGROUND OF THE INVENTION

1. Field of the Invention

Generally, the present disclosure relates to the manufacture of semiconductor devices, and, more specifically, to various novel methods of forming replacement gate structures and bottom and top source/drain regions on a vertical transistor device.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, vertical transistors, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1 is a simplistic depiction of an illustrative prior art vertical transistor device 10. In general, the vertical transistor 10 comprises a generally vertically oriented channel semiconductor structure 12A that extends upward from a front surface 12S of a semiconductor substrate 12. The semiconductor structure 12A may have a variety of different configurations when viewed from above, e.g., circular, rectangular, square, etc. The device 10 further comprises a channel region 13, a gate-all-around (GAA) gate structure 14, a bottom source/drain (S/D) region 16, a top S/D region 18, a bottom spacer 15B and a top spacer 15T. Also depicted is an illustrative bottom contact 20 that is conductively coupled to the bottom S/D region 16 and a top contact 22 that is conductively coupled to the top S/D region 18. In the depicted example, the gate structure 14 comprises a gate insulation layer 14A and a conductive gate electrode 14B. The materials of construction for the components of the device 10 may vary depending upon the particular application.

For many early device technology generations, the gate electrode structures of most transistor elements have comprised a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode stacks comprising alternative materials in an effort to avoid the short-channel effects which may be associated with the use of traditional silicon-based materials in reduced channel length transistors. For example, in some aggressively scaled transistor elements, gate electrode stacks comprising a so-called high-k dielectric/metal gate (HK/MG) configuration have been shown to provide significantly enhanced operational characteristics over the heretofore more commonly used silicon dioxide/polysilicon (SiO/poly) configurations.

One well-known processing method that has been used for forming a transistor with a high-k/metal gate structure is the so-called "gate last" or "replacement gate" technique. In the replacement gate technique, a so-called "dummy" or sacrificial gate structure is initially formed and remains in place as many process operations are performed to form the device, e.g., the formation of doped source/drain regions, performing an anneal process to repair damage to the substrate caused by the ion implantation processes and to activate the implanted dopant materials. At some point in the process flow, the sacrificial gate structure is removed to define a gate cavity where the final HK/MG gate structure for the device is formed.

Unfortunately, in some cases forming replacement gate structures on vertical transistor devices involved the formation of various features that were defined by performing one or more patterning processes, e.g., masking and etching processes, the control of the exact size and exact positioning of these patterned features is subject to the problems generally encountered when defining features using patterning processes such as, for example, positional accuracy relative to other structures, pattern transfer variations, etc. These types of issues are only expected to be more problematic as device dimensions continue to decrease with advancing technology.

The present disclosure is directed to methods of forming replacement gate structures and bottom and top source/drain regions on a vertical transistor device that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming replacement gate structures and bottom and top source/drain regions on a vertical transistor device. One illustrative method disclosed herein includes, among other things, forming an initial vertically oriented channel semiconductor structure having a first height above a substrate, forming a sacrificial spacer structure adjacent the initial vertically oriented channel semiconductor structure and, with the sacrificial spacer in position, performing at least one process operation to define a self-aligned bottom source/drain region for the device that is self-aligned with respect to the sacrificial spacer structure. In this example, the method also includes, with the sacrificial spacer in position, forming an isolation region in the trench and forming a bottom source/drain electrode above the isolation region, removing the sacrificial spacer structure and forming a bottom spacer material around the vertically oriented channel semiconductor structure above the bottom source/drain electrode.

BRIEF DESCRIPTION OF THE DRAWINGS

The disclosure may be understood by reference to the following description taken in conjunction with the accompanying drawings, in which like reference numerals identify like elements, and in which.

Figure 1:
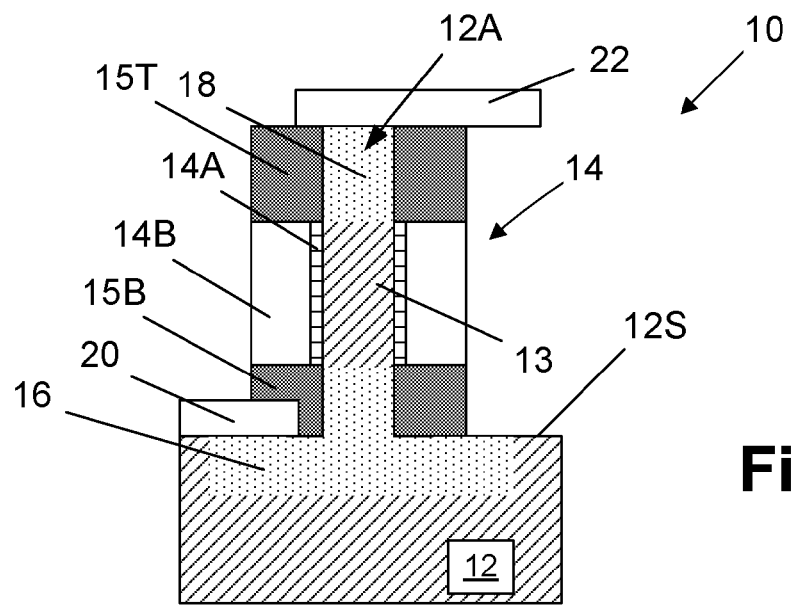
FIG. 1 simplistically depicts an illustrative prior art vertical transistor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. To the extent the term "adjacent" is used herein and in the attached claims to described a positional relationship between two components or structures, that term should be understood and construed so as to cover situations where there is actual physical contact between the two components and to cover situations where such components are positioned near one another but there is no physical contact between the two components. Physical contact between two components will be specified within the specification and claims by use of the phrase "on and in contact with" or other similar language. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., halo implant regions, well regions and the like, are not depicted in the attached drawings. Of course, the inventions disclosed herein should not be considered to be limited to the illustrative examples depicted and described herein. The various components and structures of the vertical transistor device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2:
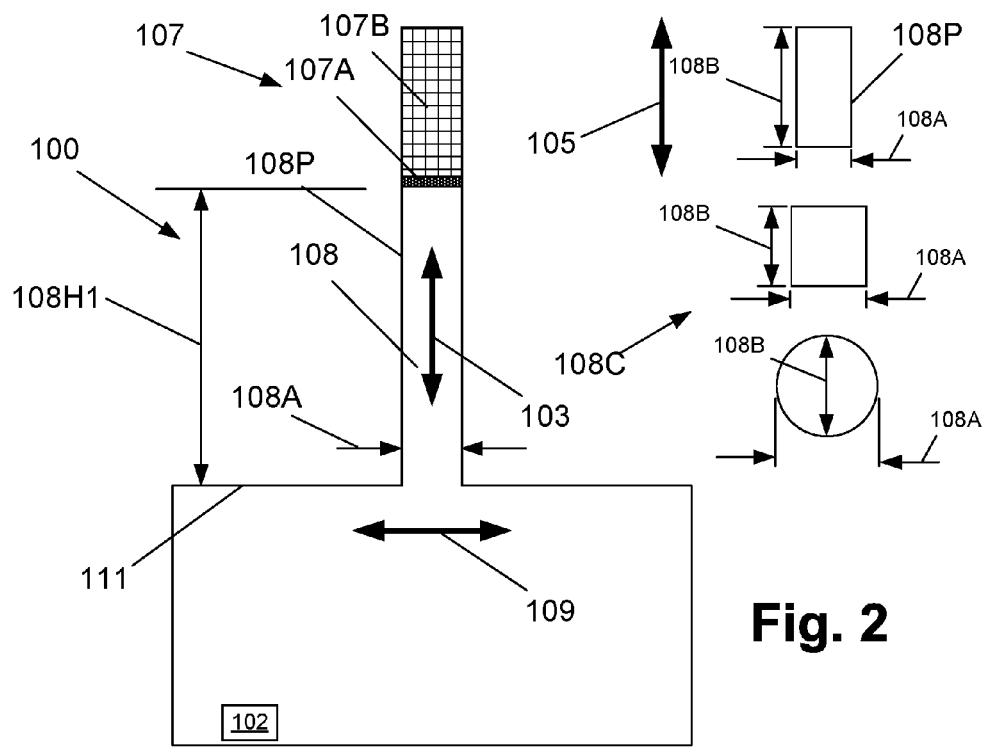
FIGS. 2-27 depict various illustrative novel methods disclosed herein for forming replacement gate structures and bottom and top source/drain regions on a vertical transistor device.

FIGS. 2-27 depict various illustrative novel methods disclosed herein for forming replacement gate structures and bottom and top source/drain regions on a vertical transistor device 100. FIG. 2 depicts one illustrative embodiment of a vertical transistor device 100 disclosed herein at an early stage of fabrication wherein several process operations have already been performed. In general, the device 100 will be formed in and above a substrate 102. The substrate 102 may have a variety of configurations, such as the depicted bulk silicon configuration. The substrate 102 may also have a semiconductor-on-insulator (SOI) or a silicon-on-insulator configuration that includes a bulk silicon layer, a buried insulation layer (silicon dioxide) and an active layer (silicon), wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

With continuing reference to FIG. 2, an initial vertically oriented channel semiconductor structure 108 has been formed for the transistor device 100. The initial vertically oriented channel semiconductor structure 108 may be formed using any of a variety of known techniques and it may have a variety of different configurations 108C when viewed from above, e.g., circular, square, rectangular, etc., as indicated in FIG. 2, and an outer perimeter 108P. During operation, current will flow through the device 100 in the direction indicated by the double arrows 103, which is the gate length direction of the device 100. The gate width direction 105 of the device 100, i.e., into and out of the plane of the drawing, is also depicted in FIG. 2. When viewed in the cross-section shown in the figures herein, the initial vertically oriented channel semiconductor structure 108 has a lateral width 108A in a cross-fin direction 109 and a lateral width 108B (see simplistic configurations 108C) in the gate width direction 105. The cross-fin direction 109 is normal to both the gate length 103 and gate width directions 105. The dimensions 108A and 108B may vary depending upon the particular application and the dimensions 108A and 108B may be the same or different depending upon the configuration 108C of the vertically oriented channel semiconductor structure 108. In the depicted example, the initial vertically oriented channel semiconductor structure 108 was defined by performing one or more etching processes through a patterned etch mask 107 so as to define an initial trench 111 in the substrate 102. The initial vertically oriented channel semiconductor structure 108 has a first or initial height 108H1. The patterned etch mask 107 may be comprised of one or more layers of material and it may be formed by performing one or more layers of material and thereafter patterning those materials using know photolithography and etching techniques. In one illustrative embodiment, the patterned etch mask 107 may be comprised of a layer of silicon dioxide 107A and a layer of silicon nitride 107B.

In the illustrative example depicted in the attached figures, the initial vertically oriented channel semiconductor structure 108 is depicted as having been formed by performing an anisotropic etching process. In other cases, the initial vertically oriented channel semiconductor structure 108 may be formed in such a manner that it has a tapered cross-sectional configuration (wider at the bottom than at the top at this point in the process flow). Thus, the size and configuration of the initial vertically oriented channel semiconductor structure 108 and the manner in which it is made should not be considered a limitation of the present invention.

Figure 3:
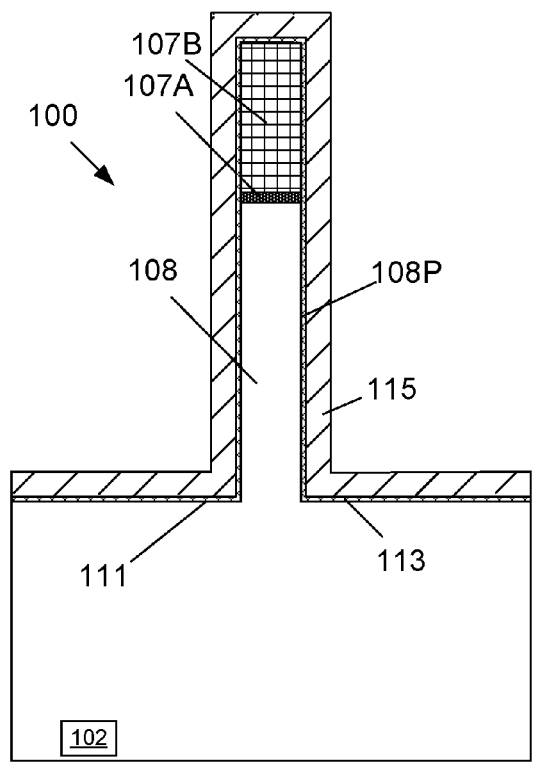
Figure 4:
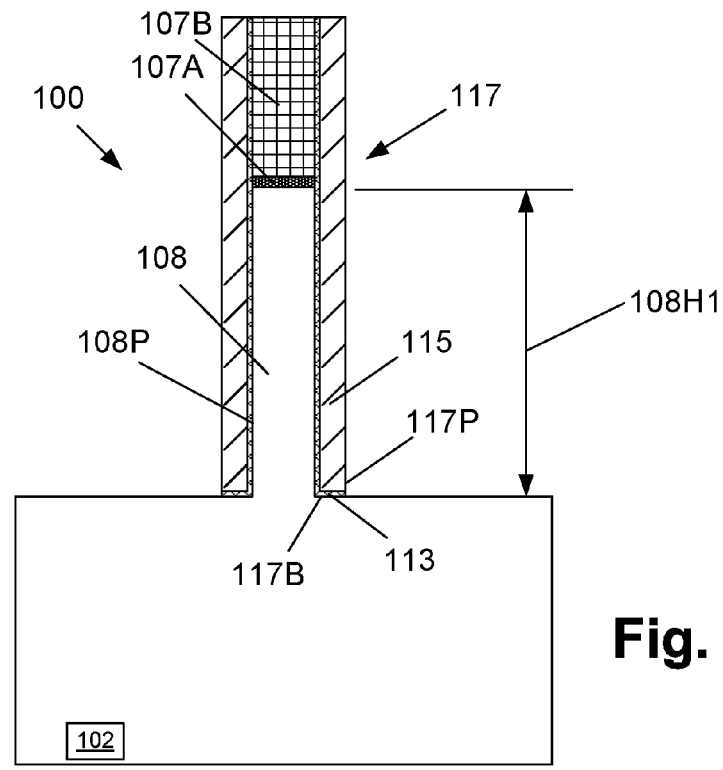

The next major process operation involves forming a sacrificial spacer structure 117 around the entire outer perimeter of the initial vertically oriented channel semiconductor structure 108, as shown in FIGS. 3 and 4. Accordingly, FIG. 3 depicts the device 100 after a conformal deposition process was performed to form a sacrificial layer of material 113 (e.g., silicon dioxide) around the entire outer perimeter of the initial vertically oriented channel semiconductor structure 108 and after another conformal deposition process was performed to form another sacrificial layer of material 115 (e.g., silicon nitride) on the sacrificial layer of material 113. The layers 113 and 115 may be formed to any desired thickness.

FIG. 4 depicts the device 100 after a plurality of anisotropic etching processes were sequentially performed on the layers 115, 113 to define the sacrificial spacer structure 117 around the entire outer perimeter 108P of the initial vertically oriented channel semiconductor structure 108. The outer perimeter 117P of the sacrificial spacer structure 117 at its base 117B will generally have a configuration that corresponds to the outer perimeter 108P of the initial vertically oriented channel semiconductor structure 108. Of course, the sacrificial spacer structure 117 may be comprised of only a single layer of material or more than the two illustrative layers 113, 115 depicted herein. The lateral width of the sacrificial spacer structure 117 at the base 117B of the sacrificial spacer structure 117 (the point where it contacts the initial trenches 111) may vary depending upon the particular application. In one illustrative embodiment, the sacrificial spacer structure 117 may have a lateral width at the base 117B of the sacrificial spacer structure 117 that falls within the range of about 1-5 nm.

Figure 5:
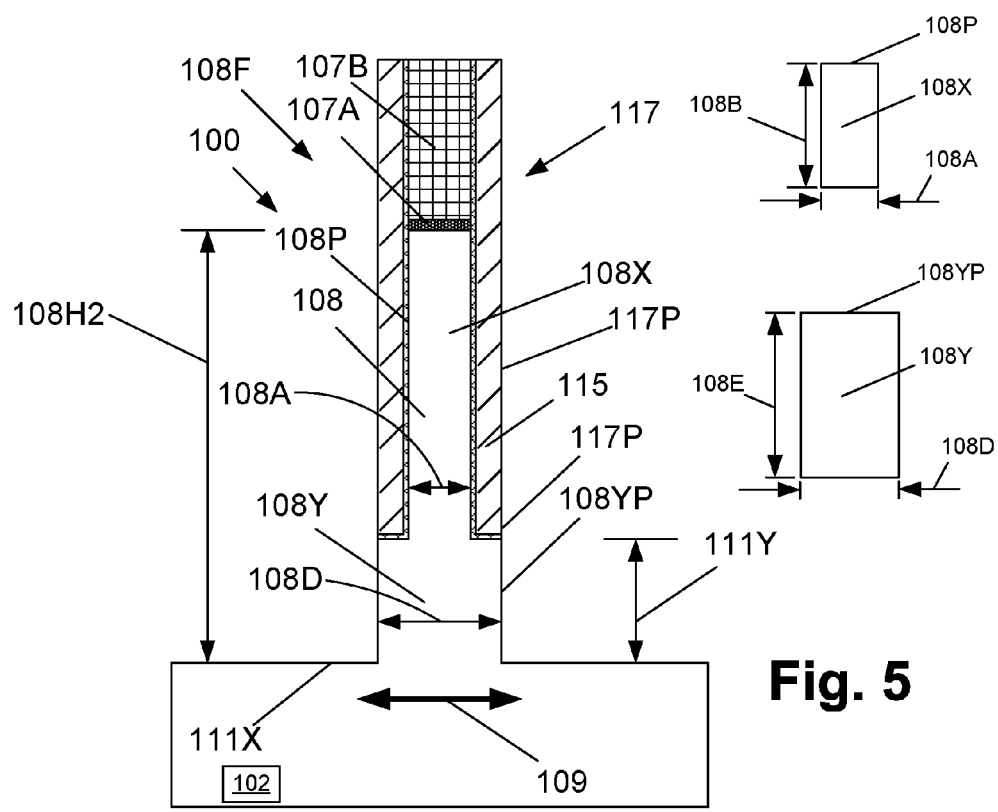

FIG. 5 depicts the device 100 after another anisotropic etching process was performed to extend the depth of the initial trench 111 and thereby define a deeper trench 111X in the substrate 102. The formation of the deeper trench 111X results in the definition of the final vertically oriented channel semiconductor 108F structure having a final height 108H2 that is greater than the first height 108H1. The additional depth 111Y of the deeper trench 111X may vary depending upon the particular application, e.g., 10-100 nm. The final vertically oriented channel semiconductor structure 108F comprises an upper portion 108X and a lower portion 108Y wherein the lateral width 108D of the bottom portion 108Y is greater than the lateral width 108A of the upper portion 108X when viewed in a cross-section taken through the gate width 105 of the device 100. As shown in the simplistic plan views of the final vertically oriented channel semiconductor 108F in FIG. 5 (wherein the structure has an illustrative rectangular cross-sectional when viewed in a cross-section), the lower portion 108Y also has a greater dimension 108E in the cross-fin direction 109 than the dimension 108B of the upper portion 108X. This increased size of the lower portion 108Y relative to the size of the upper portion 108X is due to the fact that the lower portion 108Y is self-aligned with respect to the sacrificial spacer 117. The lower portion 108Y is self-aligned in the sense that dimensions 108D and 108E of the lower portion 108Y are defined by the dimensions corresponding to the outer perimeter 117P of the sacrificial spacer 117 at its base 117B. That is, an outer perimeter 108YP of the lower portion 108Y of the final vertically oriented channel semiconductor 108F substantially corresponds in terms of size and configuration to the outer perimeter 117P of the sacrificial spacer 117 at its base 117B.

Figure 6:
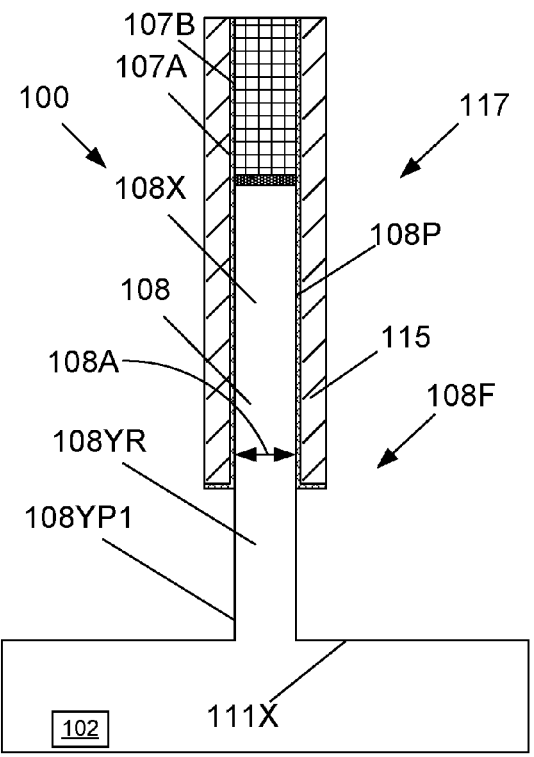

FIG. 6 depicts the device 100 after a timed, isotropic etching process was performed to laterally recess or remove portions of the lower portion 108Y of the final vertically oriented channel semiconductor 108F. The amount of lateral recessing of the lower portion 108Y may vary depending on the particular application. In one illustrative embodiment, the lower portion 108Y may be recessed such that the recessed lower portion 108YR has an outer perimeter 108YP1 that substantially corresponds in terms of size and configuration to the outer perimeter 108P of the upper portion 108X of the initial vertically oriented channel semiconductor structure 108.

Figure 7:
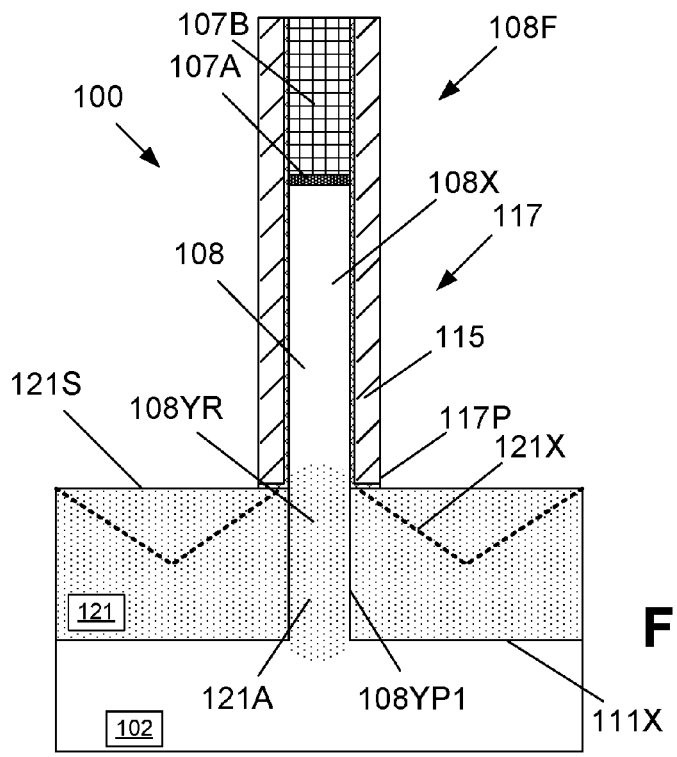

FIG. 7 depicts the device 100 after one illustrative process flow wherein an epitaxial growth process was performed to form an epi semiconductor material 121 in the recessed trenches 111X around the entire outer perimeter 108YP1 of the recessed lower portion 108YR of the final vertically oriented channel semiconductor 108F. The epi semiconductor material 121 may be comprised of different materials depending upon the type of device under construction, e.g., SiGe for a P-type device, SiC for an N-type device. In the depicted example, the epi material 121 has a simplistically depicted substantially planar upper surface 121S. However, depending upon the material of the epi semiconductor material 121 and the crystalline orientation of the material of the substrate 102, the epi semiconductor material 121 may have a faceted upper surface 121X, as depicted by the dashed lines in FIG. 6. For ease of explanation, the epi semiconductor material 121 will be depicted in subsequent drawings as only having the substantially planar upper surface 121S. The epi semiconductor material 121 may be in situ doped with an appropriate dopant 121A (N-type or P-type depending upon the type of device under construction) during the formation of the epi semiconductor material 121. As depicted, during the epi deposition process and/or during a heat treatment process performed after the epi material 121 is formed, dopants 121A may migrate into the recessed lower portion 108YR of the vertically oriented channel semiconductor structure 108.

Figure 8:
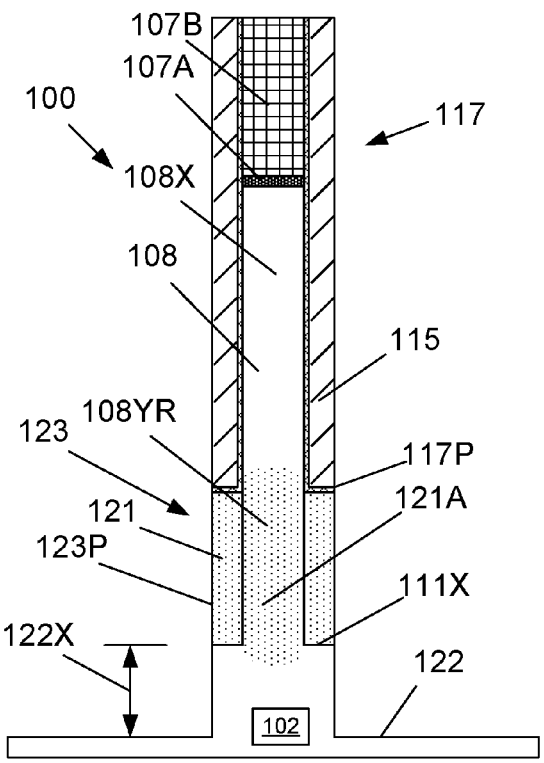

FIG. 8 depicts the device 100 after one or more anisotropic etching processes were performed to extend the depth of the deeper trenches 111X and thereby define an isolation trench 122 in the substrate 102. The additional depth 122X of the isolation trench 122 relative to the deeper trench 111X may vary depending upon the particular application, e.g., 30-300 nm. This process operation results in the formation of a self-aligned bottom source/drain region 123 for the device 100. In the depicted example in FIG. 8, the self-aligned bottom source/drain region 123 is comprised of at least part of the lower portion 108YR of the final vertically oriented channel semiconductor 108F and a portion of the epi semiconductor material 121. The self-aligned bottom source/drain region 123 is self-aligned in the sense that dimensions of the self-aligned bottom source/drain region 123 are defined by the dimensions corresponding to the outer perimeter 117P of the sacrificial spacer 117 at its base 117B. That is, an outer perimeter 123P of the self-aligned bottom source/drain region 123 of the device 100 substantially corresponds in terms of size and configuration to the outer perimeter 117P of the sacrificial spacer 117 at its base 117B. In other applications, the bottom source/drain region may be formed by patterning, i.e., by lithography and etching, so as to form a non-self-aligned bottom source/drain region.

Figure 9:
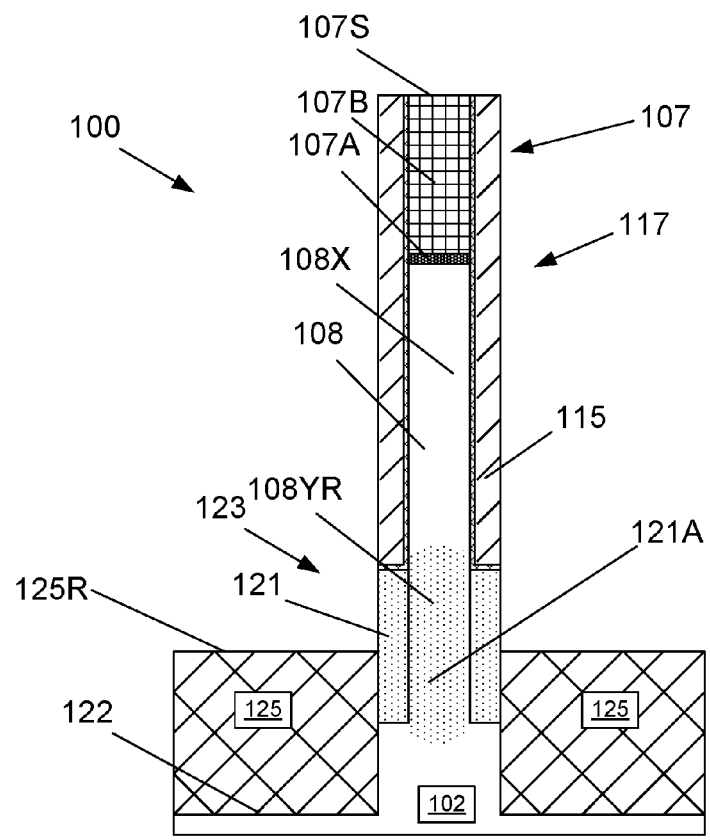

FIG. 9 depicts the device 100 after several process operations were performed to form an isolation structure 125 in the isolation trench 122. First, a layer of insulating material 125, e.g., a flowable oxide, silicon dioxide, was formed above the device 100. Thereafter, a chemical mechanical polishing (CMP) process was performed to planarize the upper surface of the insulating material 125 with the upper surface 107S of the patterned hard mask layer 107. Then a recess etching process was performed on the layer of insulating material 125 until such time that it has a recessed upper surface 125R that exposes a portion of the self-aligned bottom source/drain region 123. The amount of the self-aligned bottom source/drain region 123 exposed may vary depending upon the particular application. The isolation structure 125 was formed with the sacrificial spacer structure 117 in position.

Figure 10:
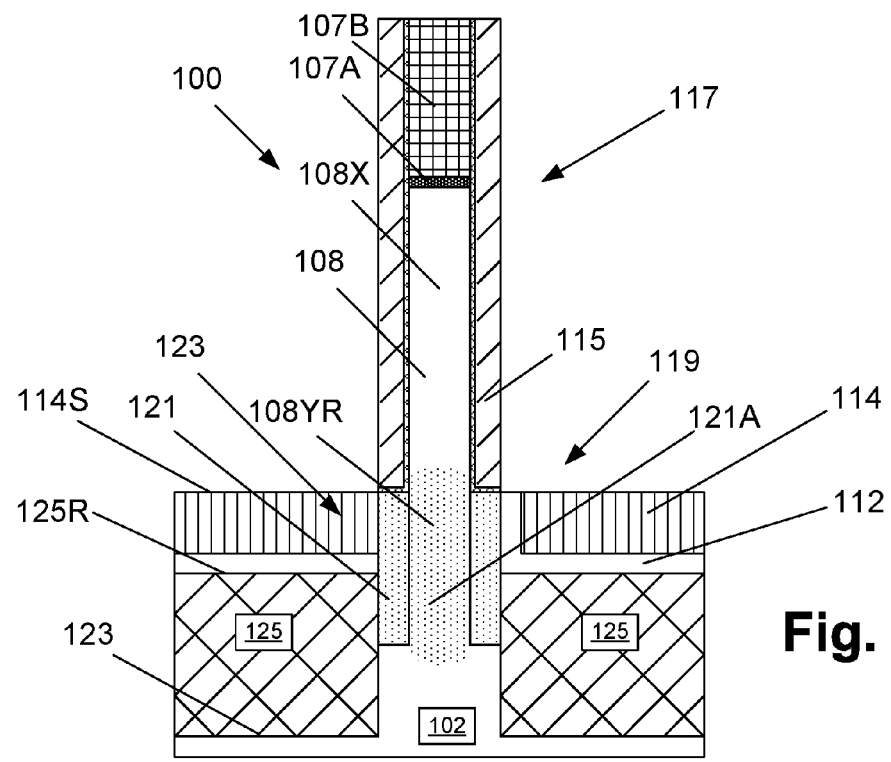

FIG. 10 depicts the device 100 after several process operations were performed to form a bottom source/drain electrode 119 for the device 100 that may be used to conductively contact the exposed portions of the self-aligned bottom source/drain region 123. The bottom electrode 119 was formed with the sacrificial spacer structure 117 in position. In the depicted example, the bottom electrode 119 comprises a conductive liner 112 (e.g., tungsten silicide) and a conductive metal layer 114 (e.g., tungsten). The layers of material 112, 114 were formed around the entire outer perimeter of the self-aligned bottom source/drain region 123. The conductive liner 112 may be formed by performing a conformal deposition process and its thickness may vary depending upon the particular application. In the case of a silicide, the metal may be reacted with the underlying semiconductor to form a low-resistivity compound. After the formation of the metal layer 114, a recess etching process was performed to remove portions of the conductive liner 112 from the sides of the sacrificial spacer structure 117 and to recess the conductive metal layer 114 such that it has a recessed upper surface 114S as depicted in FIG. 10. In the case of silicide, the unreacted metal may be selectively etched from the reacted silicide phase.

Figure 11:
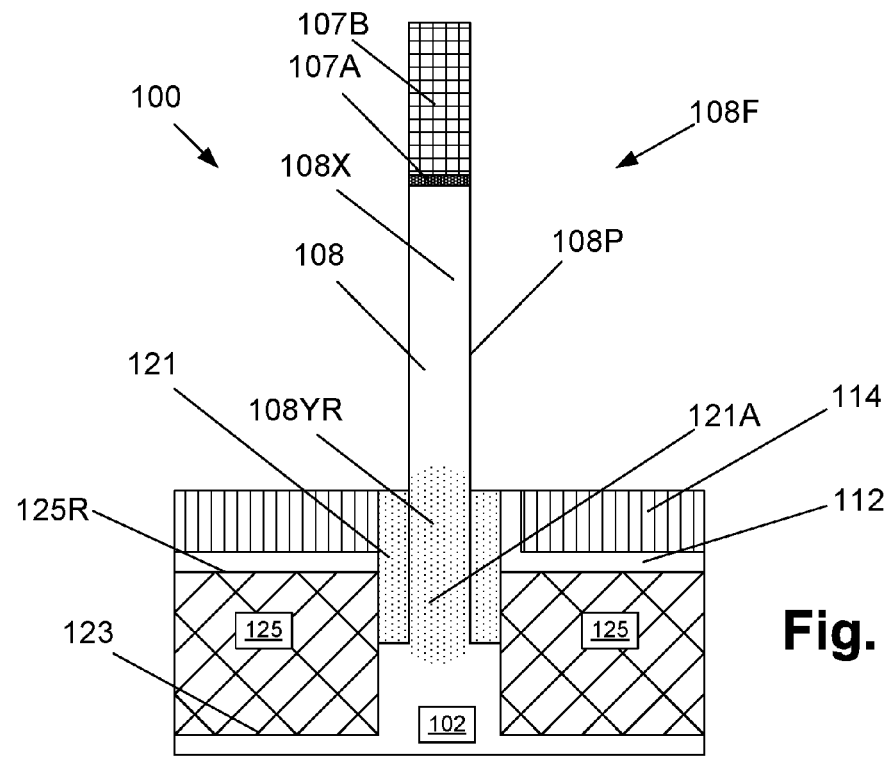

FIG. 11 depicts the device 100 after one or more etching processes were performed to remove the sacrificial spacer structure 117 and thereby expose at least the outer perimeter 108P of the upper portion 108X of the final vertically oriented channel semiconductor 108F.

Figure 12:
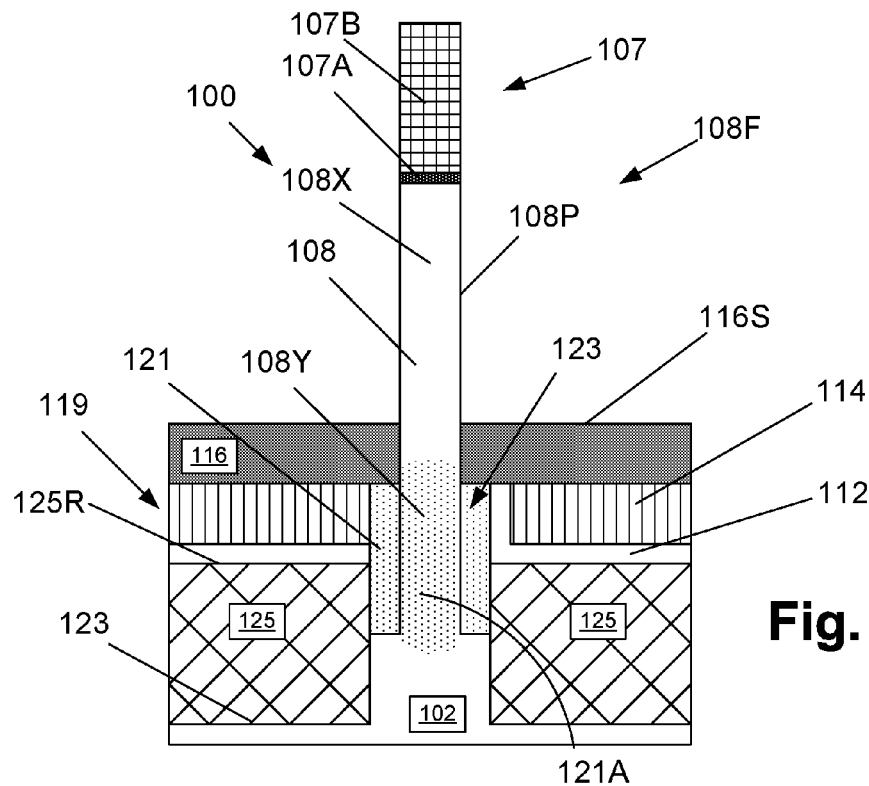

FIG. 12 depicts the device 100 after a bottom spacer 116 was formed above the bottom electrode 119 and around the entire outer perimeter 108P of the final vertically oriented channel semiconductor 108F. In one illustrative embodiment, the bottom spacer 116 was formed by depositing a layer of bottom spacer material (e.g., silicon nitride) and performing a CMP process on the layer of bottom spacer material that stops on the patterned hard mask 107. Thereafter, a recess etching process was performed to recess the layer of bottom spacer material such that it has a recessed upper surface 116S as depicted in FIG. 12. The bottom spacer 116 may be formed to any desired thickness and it may be made of any desired material. Alternatively, the bottom spacer 116 may be substantially anisotropically deposited wherein the material thickness is greater on horizontally oriented surfaces and thinner on vertically oriented surfaces (i.e., the perimeter 108P) and then isotropically trimmed to leave only the spacer material having the upper surface 116S.

Figure 13:
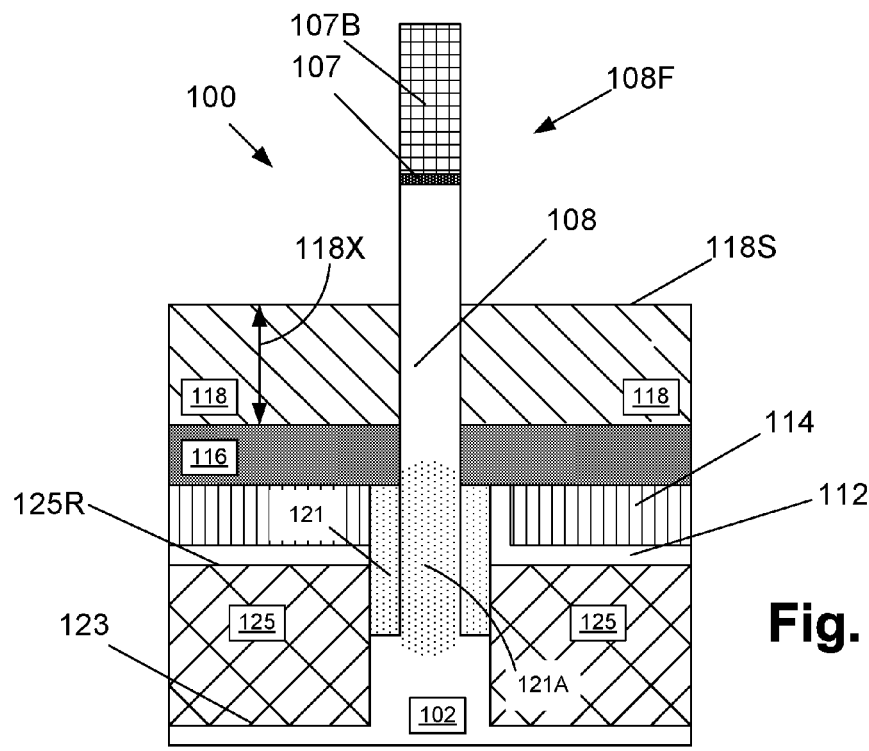

FIG. 13 depicts the device 100 after several process operations were performed. First, a sacrificial layer of material 118 (e.g., silicon dioxide) was formed above the bottom spacer 116 and around the entire outer perimeter 108P of the final vertically oriented channel semiconductor 108F. The sacrificial layer of material 118 was formed such that it has a recessed upper surface 118S positioned at the location depicted in FIG. 13. In some applications, the sacrificial layer of material 118 may be initially deposited and planarized and then a recess etching process may be performed on the sacrificial layer of material 118 such that it has the depicted recessed upper surface 118S. However, depending upon the manner in which the sacrificial layer of material 118 was formed, in other applications, the surface 118S may be an as-deposited surface. As will be explained more fully below, the vertical thickness 118X of the sacrificial layer of material 118 will generally correspond to the gate length of the device 100 and the vertical height of a replacement gate cavity for the device 100.

Figure 14:
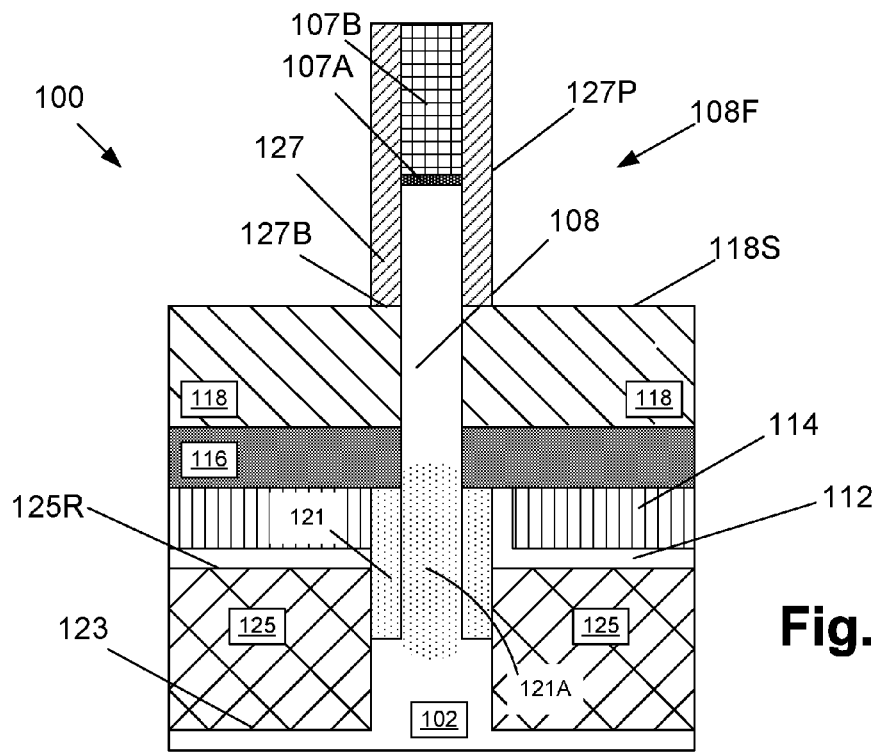

FIG. 14 depicts the device 100 after a non-sacrificial spacer structure 127 was formed above the sacrificial layer of material 118 and around the entire outer perimeter 108P of the final vertically oriented channel semiconductor 108F. The outer perimeter 127P of the non-sacrificial spacer structure 127 at its base 127B (i.e., at the point where the non-sacrificial spacer structure 127 contacts the sacrificial layer of material 118) will generally have a configuration that corresponds to the outer perimeter 108P of the initial vertically oriented channel semiconductor structure 108. Of course, the non-sacrificial spacer structure 127 may be comprised of only a single layer of material or multiple layers of materials, e.g., silicon nitride, a low-k material (k value of 7.5 or less), etc. The lateral width of the non-sacrificial spacer structure 127 at the base 127B may vary depending upon the particular application. In one illustrative embodiment, the non-sacrificial spacer structure 127 may have a lateral width at the base 127B that falls within the range of about 2-20 nm. The non-sacrificial spacer structure 127 may be formed by performing one or more conformal deposition processes to form the layer or layers of material for the non-sacrificial spacer structure 127, and thereafter performing one or more anisotropic etching processes. It should also be understood that additional patterning steps may be included at this stage to include planar support structures defined using conventional lithography techniques.

Figure 15:
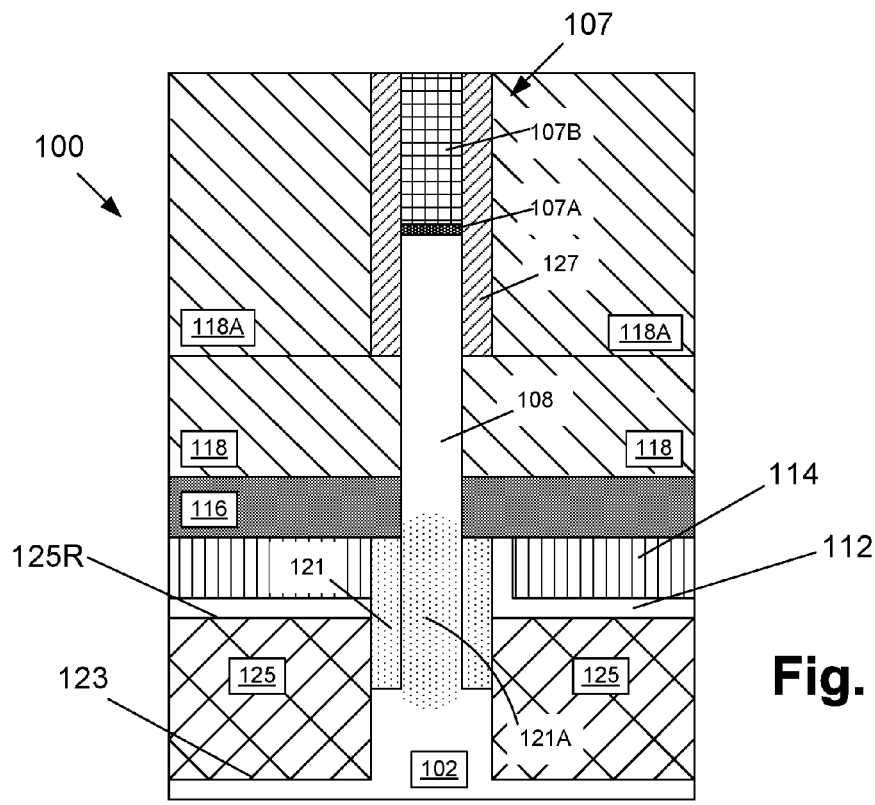

FIG. 15 depicts the device 100 after another sacrificial layer of material 118A (e.g., silicon dioxide) was formed above the sacrificial layer of material 118 and around the entire outer perimeter 127P of the non-sacrificial spacer structure 127. The sacrificial layer of material 118A was formed by initially depositing the material and performing a CMP process that stops on the patterned hard mask 107.

Figure 16:
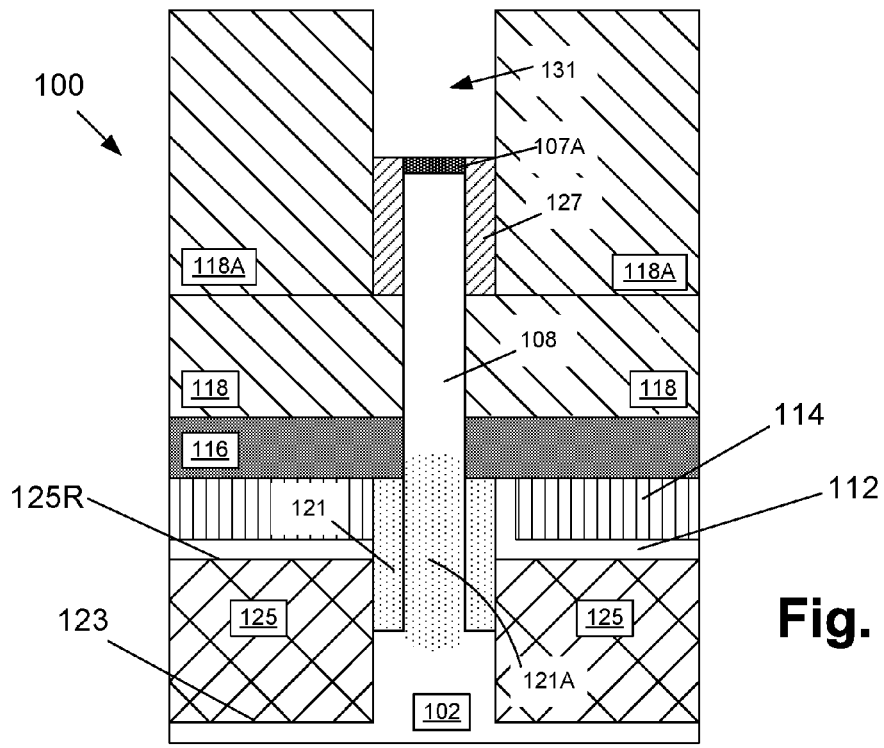

FIG. 16 depicts the device 100 after an etching process was performed to remove the portion 107B of the patterned hard mask feature 107 selectively relative to the surrounding material. The process operation results in the definition of a cavity 131 and exposes the portion 107A of the patterned hard mask feature 107. It should be understood that the shape of the cavity 131 will be determined by the selectivity of the etch process used relative to spacer 127, which may be preserved more or less depending on etch conditions.

Figure 17:
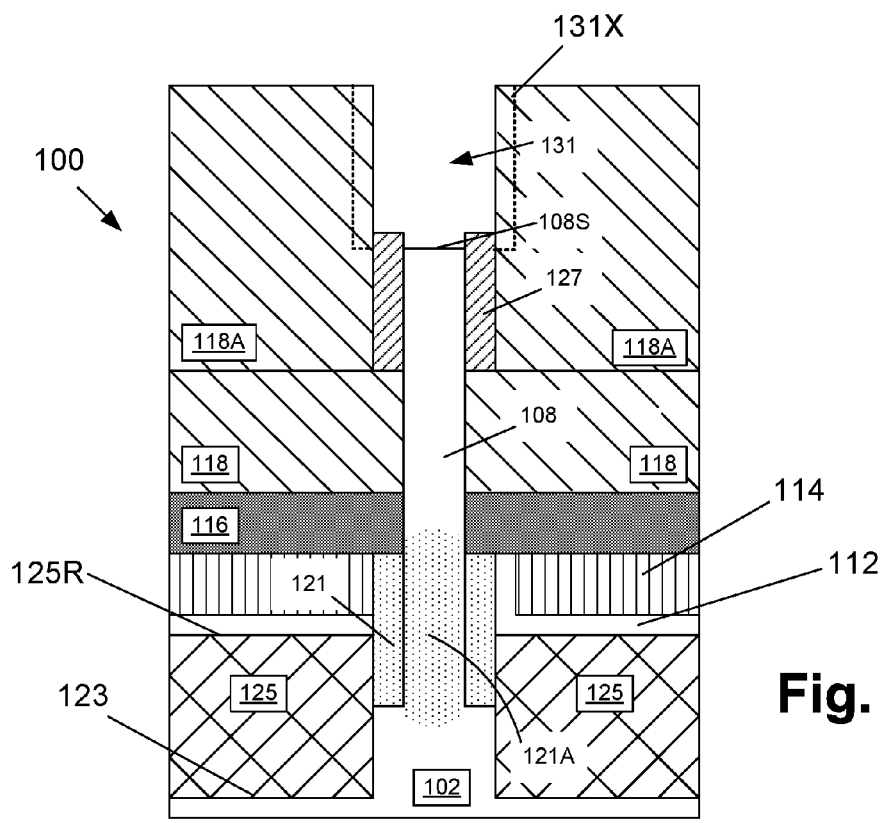

FIG. 17 depicts the device 100 after a brief etching process was performed to remove the portion 107A of the patterned hard mask feature 107 selectively relative to the surrounding material. The process operation results in exposure of the upper surface 108S of the final vertically oriented channel semiconductor 108F. In some applications, this process operation may result in an increase in the lateral size and depth of the cavity 131, as reflected by the dashed lines 131X. However, any increase in the size of the cavity 131 will not be reflected in the remaining drawings.

Figure 18:
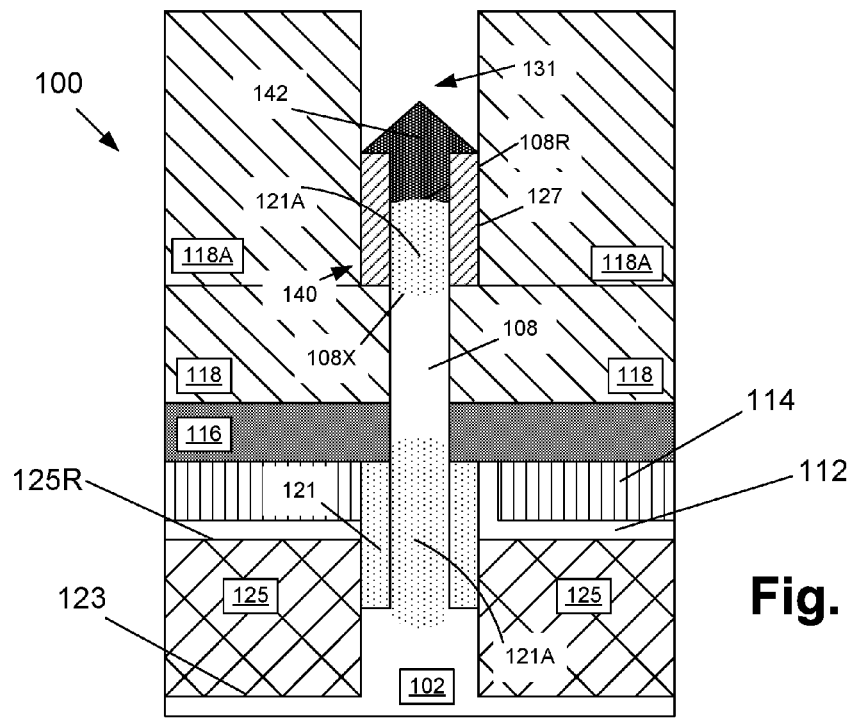

FIG. 18 depicts the device 100 after a top S/D region 140 was formed in the final vertically oriented channel semiconductor 108F. In the depicted example, a recess etching process was performed to recess the final vertically oriented channel semiconductor 108F such that it has a recessed upper surface 108R. Then, an epitaxial growth process was performed to form an epi semiconductor material 142 on the exposed recessed surface 108R of the final vertically oriented channel semiconductor 108F. The epi semiconductor material 142 may be comprised of different materials depending upon the type of device under construction, e.g., SiGe for a P-type device, SiC for an N-type device. In the depicted example, the epi material 142 has a simplistically depicted faceted upper surface. The epi semiconductor material 142 may be in situ doped with an appropriate dopant 121A (N-type or P-type depending upon the type of device under construction) during the formation of the epi semiconductor material 142. As depicted, during the epi deposition process and/or during a heat treatment process performed after the epi material 142 is formed, dopants 121A migrate into the upper portion 108X of the final vertically oriented channel semiconductor 108F. As an alternative process flow, the top S/D region 140 may be formed by performing one or more ion implantation processes through patterned implant masks (not shown). Then, as an option, the epi semiconductor material 142 may be formed on the exposed upper surface 108R of the final vertically oriented channel semiconductor 108F by performing an epitaxial growth process.

Figure 19:
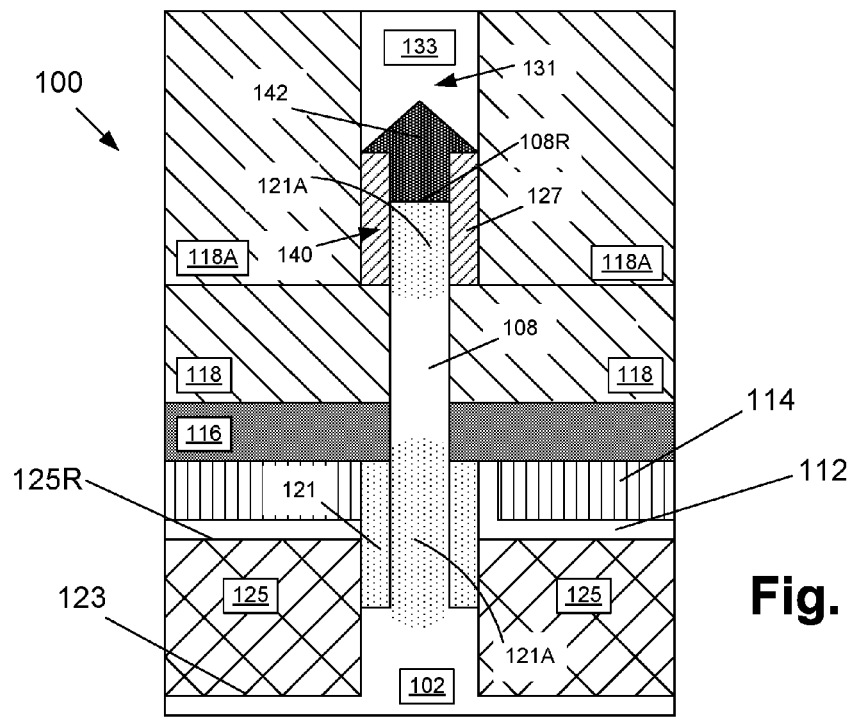

FIG. 19 depicts the device 100 after a protective cap layer 133 was formed in the cavity 131 above the epi semiconductor material 142. The protective cap layer 133 was formed by depositing an appropriate material, such as silicon nitride, so as to overfill the cavity 131 above the epi semiconductor materials 142 and thereafter performing a CMP process to remove excess materials positioned above the upper surface of the layer of insulating material 118A. Additionally, although not separately depicted, a metal silicide layer (not shown) may be formed on the epi semiconductor material 142 prior to depositing the material of the protective cap layer 133.

Figure 20:
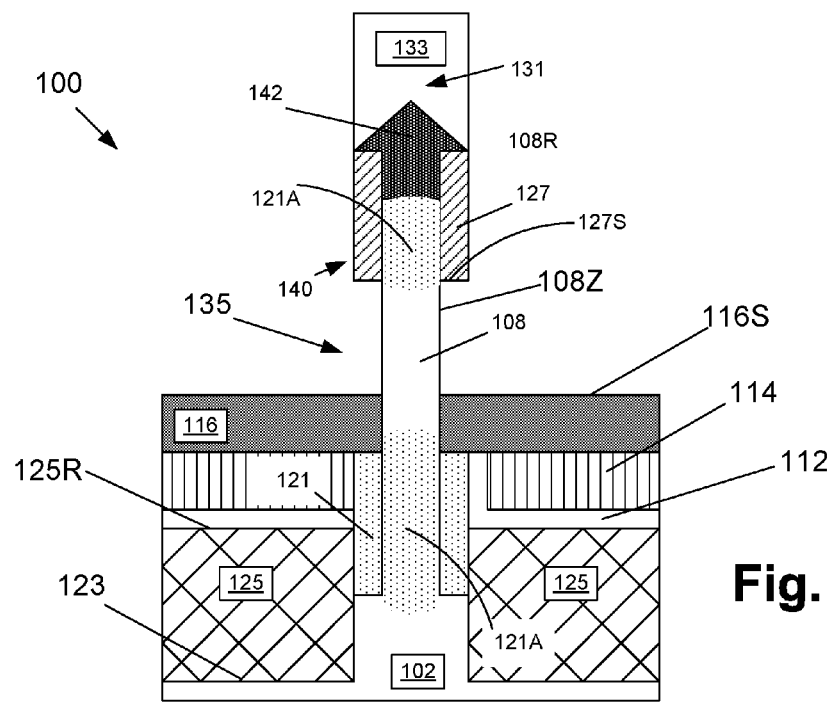

FIG. 20 depicts the device 100 after a substantially isotropic etching process was performed to remove the sacrificial material layers 118A, 118 relative to the surrounding materials. The removal of the sacrificial material layers 118A, 118 results in the formation of a replacement gate cavity 135 for the device 100 around the entire outer perimeter of the final vertically oriented channel semiconductor 108F wherein the sidewalls 108Z of the final vertically oriented channel semiconductor 108F are exposed. As depicted, the replacement gate cavity 135 is the area between the bottom surface 127S of the sidewall spacer 127 and the surface 116S of the layer of a bottom spacer material 116.

Figure 21:
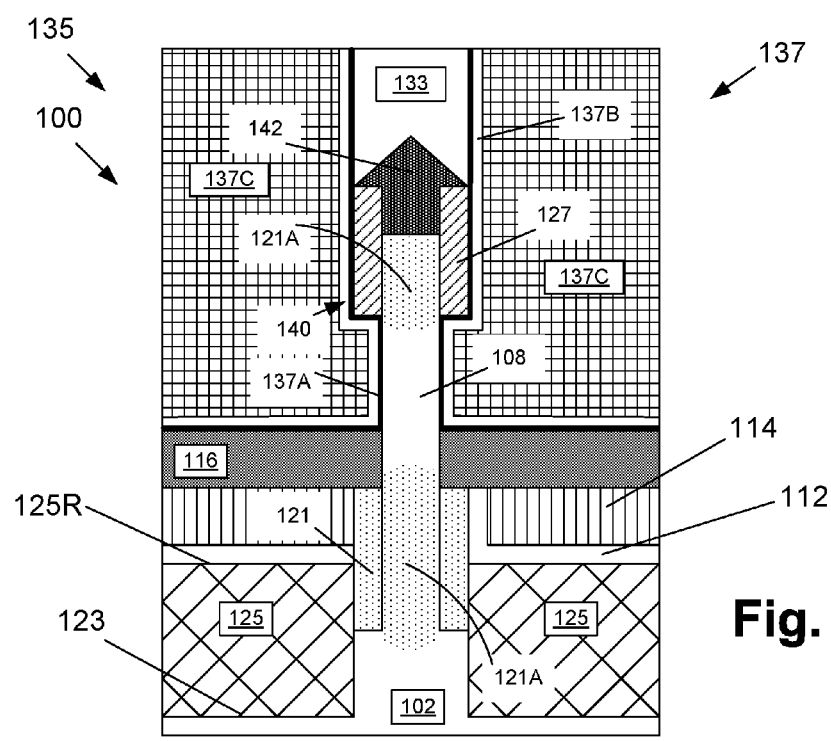

FIG. 21 depicts the device 100 after gate materials generally designated with the reference number 137 for the replacement gate structure for the device 100 were formed in the replacement gate cavity 135 and after one or more CMP processes were performed using the protective cap layer 133 as a polish stop so as to remove excess materials. In one illustrative example, the same gate material 137 may be used for the replacement gate structure for both N- and P-type devices. In other applications, by formation of appropriate masking layers (not shown), the gate materials 137 used for N- and P-type devices may be different. In the example depicted in FIG. 21, the gate materials 137 comprise a gate insulation layer 137A, a metal-containing layer 137B and a bulk conductive material layer 137C. The thickness and composition of these gate materials 137 may vary depending upon the particular application, and the relative thickness of these gate material layers 137 shown in the drawings is not to scale.

In one illustrative embodiment, the layer of insulating material 137A may be made of a high-k (k value of 10 or greater) insulating material, such as hafnium oxide, while the metal-containing layer 137B may be made of a material such as titanium nitride. The bulk conductive material layer 137C may be comprised of a material such as a metal, a metal alloy, tungsten or a doped polysilicon. The layers 137A, 137B may be formed by performing a conformal deposition process, such as an ALD process.

Figure 22:
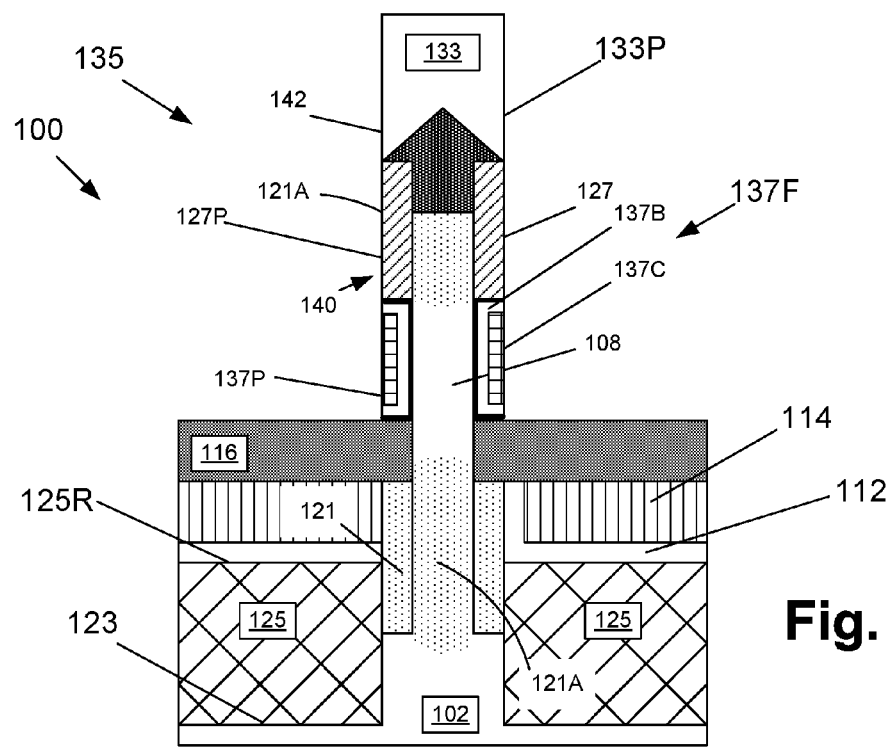

FIG. 22 depicts the device 100 after one or more anisotropic etching processes were performed that stops on the bottom spacer layer 116 to remove the exposed gate materials 137 that are not protected by the protective cap layer 133 and/or the non-sacrificial spacer 127. This operation results in the definition of a final self-aligned replacement gate structure 137F for the device 100. The gate structure 137F is self-aligned in the sense that the dimensions of the final replacement gate structure 137F are defined by the dimensions corresponding to the outer perimeter 133P of the protective cap layer 133 at its base and/or the outer perimeter 127P of the non-sacrificial spacer 127 at its base. That is, an outer perimeter 137P of the self-aligned final replacement gate structure 137F of the device 100 substantially corresponds in terms of size and configuration to the outer perimeter 133P of the protective cap layer 133 and/or to the outer perimeter 127P of the non-sacrificial spacer 127 at its base. Arriving at the final replacement gate structure 137F depicted in FIG. 22 may involve performing a single etching process with an etchant that can remove all of the materials 137A, 137B and 137C at more or less the same rate. In other applications, to arrive at the final replacement gate structure 137F depicted in FIG. 22, several etching processes with different etchants may be employed to remove portions of the materials 137A, 137B and/or 137C relative to surrounding materials.

Figure 23:
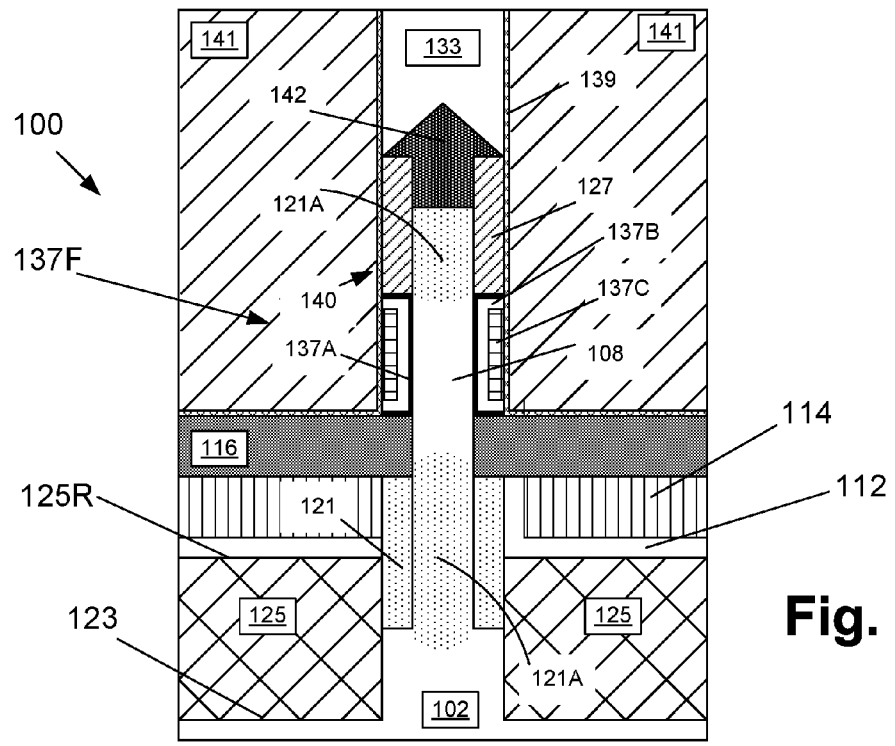

FIG. 23 depicts the device after several process operations were performed. First, a non-conductive liner layer material 139 (e.g., an insulating material having a dielectric constant of 7.5 or less, such as silicon nitride, SiOCN, SIBCN, etc.) was formed on the device 100 by performing a conformal deposition process. The thickness of the liner layer 139 may vary depending upon the particular application, e.g., 3-6 nm. Next, a layer of insulating material 141, e.g., a flowable oxide, a CVD silicon dioxide, etc., was formed above the device 100. Thereafter, at least one chemical mechanical polishing (CMP) process was performed to planarize the upper surface of the insulating material 141 with the upper surface of the protective cap layer 133.

Figure 24:
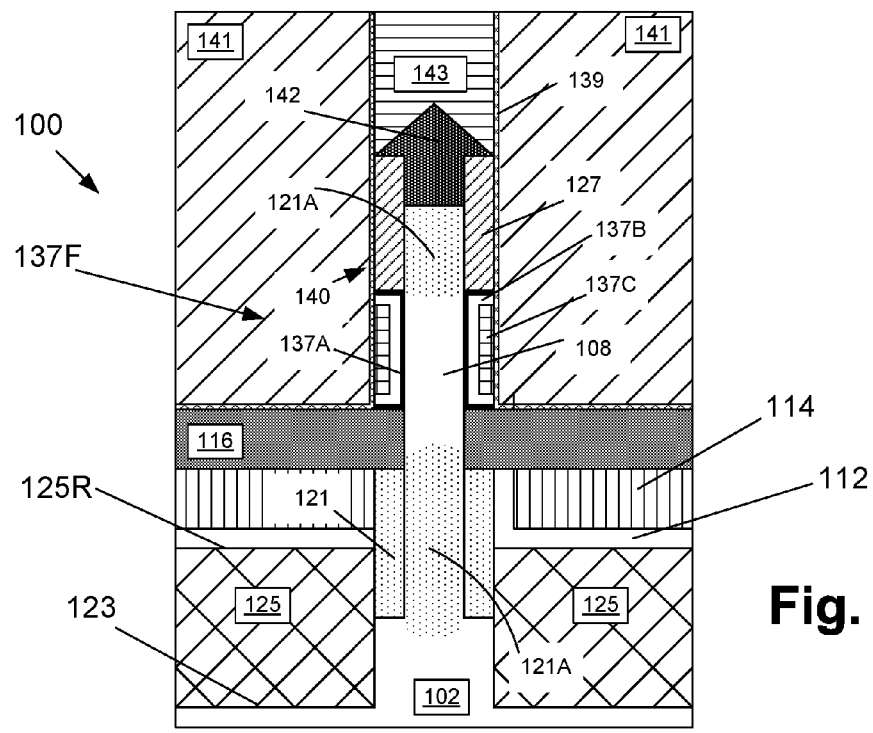

FIG. 24 depicts the device after a simplistically depicted upper S/D contact 143 was formed for the device 100. The upper S/D contact 143 was formed by removing the protective cap layer 133, then depositing an appropriate contact metal, such as tungsten, so as to overfill the space above the epi semiconductor material 142 and thereafter performing a CMP process to remove excess materials positioned above the upper surface of the layer of insulating material 141. Additionally, although not separately depicted, a metal silicide layer (not shown) may be formed on the epi semiconductor material 142 prior to depositing the contact metal.

Figure 25:
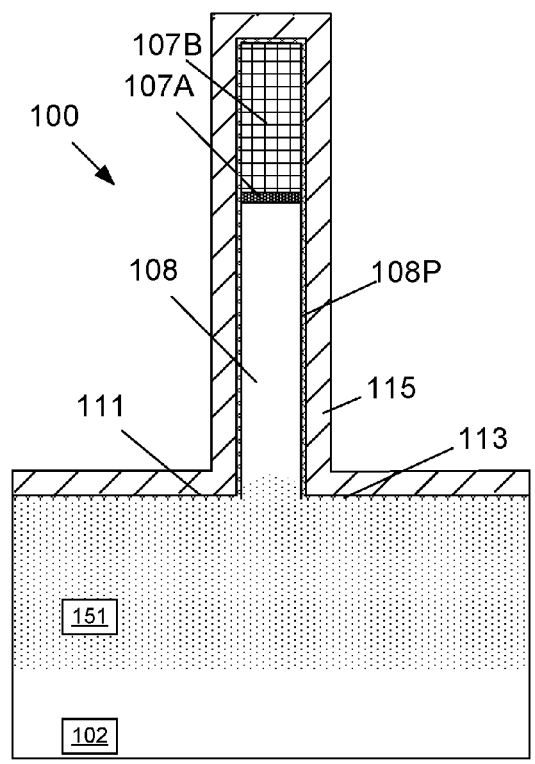
Figure 26:
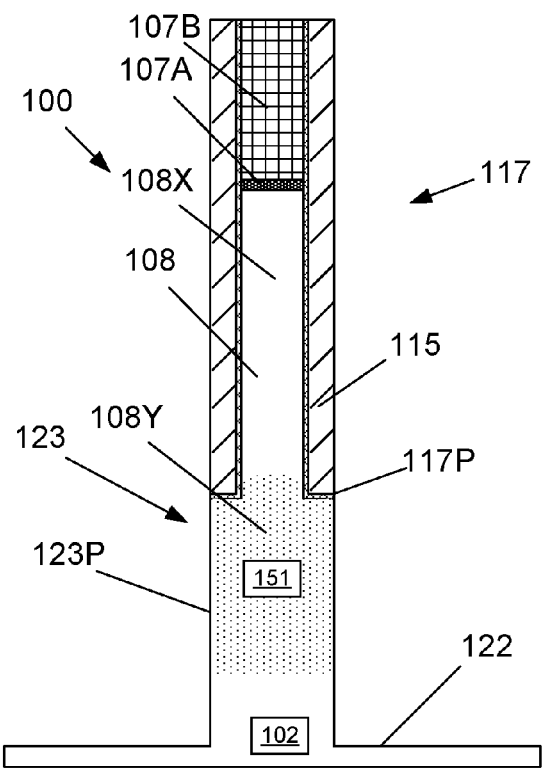
Figure 27:
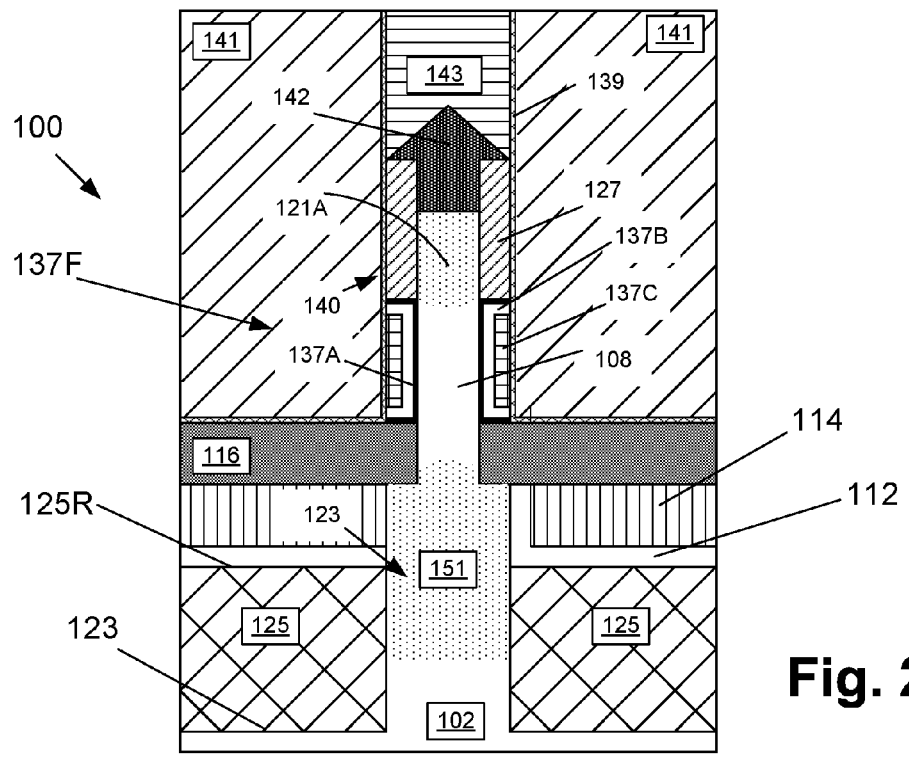

In the illustrative example described above, formation of the self-aligned bottom S/D region 123 (see, e.g., FIG. 8) involved recessing the lower portion 108Y of the final vertically oriented channel semiconductor 108F (FIG. 6), depositing the epi semiconductor material 121 (FIG. 7) and performing an etching process to remove portions of the epi semiconductor material 121 that were not covered by the sacrificial spacer structure 127. However, in some applications, the self-aligned bottom S/D region 123 may be formed without having to form the epi semiconductor material 121. For example, the dopant material for the bottom S/D region 123 may be introduced into the vertically oriented channel semiconductor structure by way of performing a conventional doping process (e.g., ion implantation, plasma doping, solid phase doping, etc.) at some point before or after the formation of the initial vertically oriented channel semiconductor structure 108 or even after the formation of the sacrificial spacers structure 117 and the etching of the underlying substrate. FIG. 25 corresponds to FIG. 3 except that dopants 151 for the self-aligned bottom S/D region 123 have been introduced by performing, for example, one or more ion implantation processes. FIG. 26 depicts the device 100 at a point that corresponds approximately to that shown in FIG. 8, with the exception that the step of forming the deeper trench 111X (see FIG. 7) to remove exposed portions of the epi material 121 has been omitted. That is, in the case where the dopants are introduced by way of performing a conventional doping process, after the formation of the sacrificial spacer 117, the substrate may be etched to define the isolation trench 122 to the final desired depth, thereby resulting in the formation of a self-aligned bottom S/D region 123 comprised of the implanted dopants 151. FIG. 27 depicts the finished device 100 after the other processing steps described above were performed to complete the device 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a vertical transistor device, the method comprising:
    forming an initial vertically oriented channel semiconductor structure having a first height above a substrate;
    forming a sacrificial spacer structure adjacent said initial vertically oriented channel semiconductor structure;
    with said sacrificial spacer structure in position, performing at least one process operation to define a self-aligned bottom source/drain region for said device that is self-aligned with respect to said sacrificial spacer structure;
    with said sacrificial spacer structure in position, forming an isolation region in said substrate;
    with said sacrificial spacer structure in position, forming a bottom source/drain electrode above said isolation region, wherein said bottom source/drain electrode is conductively coupled to said self-aligned bottom source/drain region;
    removing said sacrificial spacer structure; and
    forming a bottom spacer material around said initial vertically oriented channel semiconductor structure above said bottom source/drain electrode.

2. The method of claim 1, wherein said self-aligned bottom source/drain region comprises an outer perimeter that generally corresponds to an outer perimeter of said sacrificial spacer structure at a base of said sacrificial spacer structure.

3. The method of claim 1, wherein said sacrificial spacer structure comprises at least one layer of material.

4. The method of claim 1, wherein said sacrificial spacer structure is formed on and in contact with a sidewall of said initial vertically oriented channel semiconductor structure and wherein a bottom surface of said sacrificial spacer structure is positioned on and in contact with an upper surface of said bottom source/drain electrode.

5. The method of claim 1, wherein, prior to performing said at least one process operation, the method further comprises performing at least one ion implantation process to introduce dopants into at least said substrate.

6. The method of claim 1, wherein, after performing said at least one process operation, the method further comprises performing at least one ion implantation process to introduce dopants into at least said substrate.

7. The method of claim 1, wherein performing said at least one process operation defines a final vertically oriented channel semiconductor structure having a second height that is greater than said first height.

8. The method of claim 7, wherein performing said at least one process operation comprises:
    performing an etching process to form a first trench in said substrate that defines said final vertically oriented channel semiconductor structure to said second height and defines a lower portion of said final vertically oriented channel semiconductor structure that has a first lateral width in a first direction that is greater than a corresponding lateral width of said initial vertically oriented channel semiconductor structure in said first direction.

9. The method of claim 8, wherein performing said at least one process operation further comprises:
    performing a recess etching process to reduce said first lateral width of said lower portion of said final vertically oriented channel semiconductor structure to a second lateral width that is less than said first lateral width;

forming an epi semiconductor material in said first trench and on an in contact with said lower portion of said final vertically oriented channel semiconductor structure having said second lateral width; and performing an etching process to remove portions of said epi semiconductor material that are not covered by said sacrificial spacer structure, wherein said self-aligned bottom source/drain region comprises said epi semiconductor material.

10. The method of claim 1, further comprising:

forming a sacrificial material layer above said bottom spacer material, said sacrificial material layer having an upper surface;

forming a non-sacrificial spacer structure adjacent final vertically oriented channel semiconductor structure and above said upper surface of said sacrificial material layer;

after forming said non-sacrificial spacer structure, forming a top source/drain region for said device;

forming a protective cap layer above said top source/drain region;

removing said sacrificial material layer so as to define a replacement gate cavity between a bottom surface of said non-sacrificial spacer structure and said bottom spacer material; and forming a self-aligned final replacement gate structure in said replacement gate cavity, wherein said self-aligned final replacement gate structure comprises an outer perimeter that generally corresponds to an outer perimeter of said protective cap layer at a base of said protective cap layer or to an outer perimeter of said non-sacrificial spacer structure at a base of said non-sacrificial spacer structure.

11. The method of claim 10, wherein an outer side surface of said self-aligned final replacement gate structure is substantially vertically aligned with an outer side surface of said protective cap layer or with an outer side surface of said non-sacrificial spacer structure.

12. The method of claim 10, wherein said non-sacrificial spacer structure is formed on and in contact with a sidewall of said final vertically oriented channel semiconductor structure and wherein a bottom surface of said non-sacrificial spacer structure is positioned on and in contact with an upper surface of said self-aligned final replacement gate structure.

13. The method of claim 10, wherein forming said self-aligned final replacement gate structure in said replacement gate cavity comprises depositing a plurality of gate material layers within said replacement gate cavity and performing at least one anisotropic etching process to remove portions of said plurality of gate material layers that are not covered by said protective cap layer or said non-sacrificial spacer structure.

14. The method of claim 10, wherein forming said self-aligned final replacement gate structure in said replacement gate cavity comprises:

performing a first conformal deposition process to form a layer of high-k insulating material on and in contact with sidewalls of said final vertically oriented channel semiconductor structure within said replacement gate cavity;

performing a second conformal deposition process to form a metal-containing layer within said replacement gate cavity and on and in contact with said layer of high-k insulating material;

forming a conductive fill material within said replacement gate cavity; and performing at least one anisotropic etching process to remove portions of said layer of high-k insulating material, said metal-containing layer and said conductive fill material that are not covered by said protective cap layer or said non-sacrificial spacer structure.

15. The method of claim 10, wherein said bottom spacer material comprises silicon nitride, said sacrificial material layer comprises silicon dioxide, a sidewall spacer comprises SiOCN and said replacement gate structure comprises a high-k gate insulation layer, a work function adjusting metal-containing layer and a conductive fill layer.

16. The method of claim 1, wherein said vertical transistor device is one of an N-type device or a P-type device.

17. A method of forming a vertical transistor device, the method comprising:

forming an initial vertically oriented channel semiconductor structure having a first height above a substrate;

forming a sacrificial spacer structure adjacent said initial vertically oriented channel semiconductor structure;

with said sacrificial spacer structure in position, performing at least one process operation to define a self-aligned bottom source/drain region for said device that is self-aligned with respect to said sacrificial spacer structure and to define a final vertically oriented channel semiconductor structure having a second height that is greater than said first height, wherein said self-aligned bottom source/drain region comprises an outer perimeter that generally corresponds to an outer perimeter of said sacrificial spacer structure at a base of said sacrificial spacer structure;

with said sacrificial spacer structure in position, forming an isolation region in said substrate;

with said sacrificial spacer structure in position, forming a bottom source/drain electrode above said isolation region, wherein said bottom source/drain electrode is conductively coupled to said self-aligned bottom source/drain region;

removing said sacrificial spacer structure; and forming a bottom spacer material around said final vertically oriented channel semiconductor structure above said bottom source/drain electrode.

18. The method of claim 17, wherein performing said at least one process operation comprises performing at least one etching process to define a trench in said substrate that defines a lower portion of said final vertically oriented channel semiconductor structure that has a first lateral width in a first direction that is greater than a corresponding lateral width of said initial vertically oriented channel semiconductor structure in said first direction.

19. The method of claim 18, wherein performing said at least one process operation further comprises:

performing a recess etching process to reduce said first lateral width of said lower portion of said final vertically oriented channel semiconductor structure to a second lateral width that is less than said first lateral width;

forming an epi semiconductor material in said trench and on an in contact with said lower portion of said final vertically oriented channel semiconductor structure having said second lateral width; and performing an etching process to remove portions of said epi semiconductor material that are not covered by said sacrificial spacer structure, wherein said self-aligned bottom source/drain region comprises said epi semiconductor material.

20. The method of claim 17, further comprising:
- forming a sacrificial material layer above said bottom spacer material, said sacrificial material layer having an upper surface;
- forming a non-sacrificial spacer structure adjacent said final vertically oriented channel semiconductor structure and above said upper surface of said sacrificial material layer;
- after forming said non-sacrificial spacer structure, forming a top source/drain region for said device;
- forming a protective cap layer above said top source/drain region;
- removing said sacrificial material layer so as to define a replacement gate cavity between a bottom surface of said non-sacrificial spacer structure and said bottom spacer material; and
- forming a self-aligned final replacement gate structure in said replacement gate cavity, wherein said self-aligned final replacement gate structure comprises an outer perimeter that generally corresponds to an outer perimeter of said non-sacrificial spacer structure at a base of said protective cap layer or to an outer perimeter of said non-sacrificial spacer at a base of said non-sacrificial spacer structure.

21. The method of claim 20, wherein an outer side surface of said self-aligned final replacement gate structure is substantially vertically aligned with an outer side surface of said protective cap layer or with an outer side surface of said non-sacrificial spacer structure.

22. The method of claim 20, wherein said non-sacrificial spacer structure is formed on and in contact with a sidewall of said final vertically oriented channel semiconductor structure and wherein a bottom surface of said non-sacrificial spacer structure is positioned on and in contact with an upper surface of said self-aligned final replacement gate structure.

23. The method of claim 20, wherein forming said self-aligned final replacement gate structure in said replacement gate cavity comprises depositing a plurality of gate material layers within said replacement gate cavity and performing at least one anisotropic etching process to remove portions of said plurality of gate material layers that are not covered by said protective cap layer or said non-sacrificial spacer structure.

24. The method of claim 20, wherein forming said self-aligned final replacement gate structure in said replacement gate cavity comprises:
- performing a first conformal deposition process to form a layer of high-k insulating material on and in contact with sidewalls of said final vertically oriented channel semiconductor structure within said replacement gate cavity;
- performing a second conformal deposition process to form a metal-containing layer within said replacement gate cavity and on and in contact with said layer of high-k insulating material;
- forming a conductive fill material within said replacement gate cavity; and
- performing at least one anisotropic etching process to remove portions of said layer of high-k insulating material, said metal-containing layer and said conductive fill material that are not covered by said protective cap layer or said non-sacrificial spacer structure.

* * * * *

UNITED STATES PATENT AND TRADEMARK OFFICE
CERTIFICATE OF CORRECTION

PATENT NO. : 9,640,636 B1  
APPLICATION NO. : 15/171795  
DATED : May 2, 2017  
INVENTOR(S) : Steven J. Bentley et al.

Page 1 of 1

It is certified that error appears in the above-identified patent and that said Letters Patent is hereby corrected as shown below:

In the Claims

Column 13, Line 2 (Claim 9, Line 9), change "on an in contact" to "on and in contact".

Column 14, Line 60 (Claim 19, Line 9), change "on an in contact" to "on and in contact".

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*